(12) United States Patent
Jenski et al.

(10) Patent No.: US 6,262,620 B1
(45) Date of Patent: Jul. 17, 2001

(54) DRIVER CIRCUITRY FOR LATCHING TYPE VALVE AND THE LIKE

(75) Inventors: Leonard W. Jenski, Roselle; Kevin G. Nowobilski, Orland Hills; Bay E. Estes, Palatine, all of IL (US)

(73) Assignee: Ranco Incorporated of Delaware, Wilmington, DE (US)

( * ) Notice: Subject to any disclaimer, the term of this patent is extended or adjusted under 35 U.S.C. 154(b) by 0 days.

(21) Appl. No.: 09/431,820

(22) Filed: Nov. 2, 1999

(51) Int. Cl.$^7$ ................................................ H03K 17/56
(52) U.S. Cl. ........................................ 327/424; 327/110
(58) Field of Search ........................... 327/108, 110, 327/423, 424, 494, 508, 587, 588; 324/415, 418, 511, 546; 361/143, 152, 154, 206, 189–191

(56) References Cited

U.S. PATENT DOCUMENTS

| | | | |
|---|---|---|---|
| 4,321,946 | 3/1982 | Paulos et al. | 137/554 |
| 4,950,919 | * 8/1990 | Rossi et al. | 327/424 |
| 5,041,773 | * 8/1991 | Takahashi | 318/696 |
| 5,293,551 | 3/1994 | Perkins et al. | 361/154 |
| 5,668,476 | 9/1997 | Archer | 324/546 |
| 5,774,323 | 6/1998 | Innes et al. | 361/187 |
| 5,784,245 | 7/1998 | Moraghan et al. | 361/154 |
| 5,808,471 | 9/1998 | Rooke et al. | 324/546 |
| 5,841,621 | 11/1998 | Dean et al. | 361/185 |
| 5,939,931 | * 8/1999 | Noro | 327/424 |
| 6,121,800 | * 9/2000 | Leighton et al. | 327/110 |
| 6,124,751 | * 9/2000 | Pidutti | 327/424 |

* cited by examiner

Primary Examiner—My-Trang Nuton
(74) Attorney, Agent, or Firm—Terrence (Terry) Martin; John M. England, Jr.; Jules Jay Morris

(57) ABSTRACT

A driver circuit for a latching type valve is provided which utilizes an electronic switch assembly to provide the dual polarity necessary to actuate the latching type valve to both its open and closed states. The driver circuitry includes a microprocessor and a slope detector circuit for monitoring the coil current used to energize the valve solenoid to determine when the valve armature has moved to its fully actuated position. The driver circuit preferably utilizes power MOSFET devices in the switch assembly configured into an H-bridge to drive the solenoid coil. Advantageously, the user of power MOSFET devices eliminates the necessity for a current sense resistor in the control circuitry, thereby decreasing power dissipation and increasing efficiency of the drive circuit, thereby prolonging the battery life used to drive the valve. A pulse of fixed duration may be utilized to transition the valve to an OFF position, or a second slope detector may be implemented to control the transition to the OFF position in like manner. Monitoring of the actual time required to actuate the valve may be utilized to signal low battery voltage or a failed valve, if desired.

19 Claims, 4 Drawing Sheets

DRIVER CIRCUITRY FOR LATCHING TYPE VALVE AND THE LIKE

FIELD OF THE INVENTION

This invention is directed to valve driver circuitry, and more particularly to solenoid driver circuitry for latching-type valves.

BACKGROUND OF THE INVENTION

Since the advent of the solenoid driven valve, fluid system designers have continued to design more and more complex systems which take advantage of the computer and remote-controllability of these valves. While early designs often required electric power of a given polarity to be continuously applied to the solenoid to maintain the armature of the valve in a given position, continuing developments soon reduced the amount of power required to be applied to the solenoid valve during such holding periods from that which was required to actually initiate and actuate the valve to that given position. Such a reduced holding power configuration greatly improved the efficiency of the systems which utilized such solenoid valves, especially in systems which required several, possibly in the hundreds, of these valves for proper system operation. While such held valves reduced the overall power consumption required by solenoid actuated valves, and while such held valves provided an additional safety feature that allowed them to automatically close (or open depending on the topology) upon loss of electric power, these held valves are not appropriate for installations which do not include a continuous supply of electric power from a utility.

In many remote locations the installation of an electrically held valve is not practical for various reasons, either because utility power is not available at the installation site, or because the routing of electric power to the particular valve locations is problematic or simply inconvenient. In these types of installations, the use of a latching-type valve is preferred. A latching type valve is one that once actuated to a given position, will maintain the valve state in that position without the further application of electric power. The construction of these latching type valves typically includes a permanent magnet and a spring. Both the spring and the permanent magnet are utilized to maintain the current state of the valve in a particular position.

During one position, the spring force is utilized to maintain that position without the necessity for a holding current to be applied to the solenoid. Once actuated to the other position, the magnetic force of the permanent magnet is sufficient to maintain the armature of the valve in the other position, also without the requirement for additional energy to be supplied to the solenoid to maintain that valve position.

The valve is transitioned between these two positions by energizing the solenoid with electric power of one polarity to move the armature to a first position, and of the opposite polarity to move the armature back. The power required must be sufficient to overcome the spring force to move the armature from the "spring held" position to the "permanent magnet held" position, and must be sufficient to overcome the magnetic force of the permanent magnet to move the armature from the "permanent magnet held" position to the "spring held" position. In this way such a valve requires no electric power to maintain the current status of the valve, it only requires a pulse of electricity through the solenoid of a given polarity to transition the value from one state to the other.

While many configurations of such valves exist, an advanced design of such a valve is illustrated in FIG. 5, and is the subject of co-pending application Ser. No. 05/942,924, filed Oct. 2, 1997, and assigned to the assignee of the instant application, the teachings and disclosure of which are hereby incorporated by reference. As may be seen in this FIG. 5, a plunger assembly 75, comprising plunger 62 and a coil spring 76 disposed within a non-magnetic guide tube 78 (for example stainless steel), resides above the diaphragm 58. The diaphragm 58 (at the location of the anchoring portion 64) and the plunger assembly 75 (at the location of flange 80 on guide tube 78) are fixably attached to the valve body 12 by means of plate 82 and fasteners 84. Although screws are shown as fasteners 24 and 84, any suitable fasteners may be utilized in the construction of the valve 10. The plunger moves axially and vertically along axis 86 under the influence of a magnetic field which is developed by a coil assembly 87 which surrounds the guide tube 78 of the plunger assembly. Together, the plunger assembly 75 and the coil assembly 87 form a solenoid which is responsible for actuating (opening and closing) the valve 10. The coil assembly 87 comprises a wire wound coil 88, which is wound upon a bobbin 90 and surrounded by coil housing 18. Together, the plunger assembly 75, the coil assembly 87, and the valve formed by primarily valve member 58 and pilot valve member 60 comprise an actuatable value unit which connects the inlet 14 to the outlet 16.

A metallic inner sleeve or pole piece 92 is disposed between the bobbin 90 and the guide tube 78 of the plunger assembly, pressed fit into the C-shaped bracket 22. The pole piece serves to fix the position of the coil assembly within the C-shaped bracket. Above the guide tube 78 is disposed a permanent magnet 94, the axial position of which is adjustable along axis 86 by means of set screw 96 and locking nut 98. Set screw 96 threads into corresponding threads 100 in the C-shaped bracket. Locking nut 98 threads into corresponding threads 102 on the outside of set screw 96. The permanent magnet is attracted to the set screw 96 and thus moves therewith. Bracket 22, having the coil assembly fixedly secured thereto by the pole piece 92 is attached to the plate 82, and hence the valve body 12, by means of fasteners 24.

Operation of this advanced design valve 10 is as follows. When in a closed position, as shown in this FIG. 5, the central portion 68 of the primary valve member (diaphragm) 58 rests on wall 74, and pilot valve member 60 closes the central portion opening 72. The valve is closed because central orifice 56 (outlet) is isolated from the horizontal annular chamber 54 (inlet). A pair of bleed holes 104 are formed in the webbed portion 66 of the diaphragm 58. The bleed holes permit fluid to pass from the chamber 54 to an internal cavity 106 of guide tube 78. As such, in the closed position, pressure is equalized on both sides of the webbed portion of the diaphragm (equal pressures in chamber 54 and cavity 106). The valve is latched in the closed position by means of the coil spring 76 which exerts pressure on the inside of the top end 108 of the guide tube, on one end, and on the top end 110 of the plunger 62.

The valve is opened by momentarily applying a voltage to electrical leads 20 to induce an electrical current in the coil which results in a magnetic field being generated having flux lines parallel to the axis 86. The force of the flux lines is sufficient to overcome the force of the coil spring 76 and the plunger moves upward along axis 86. The valve is latched in the open position by permanent magnet 94 which attracts the top end 110 of the plunger 62 (the force of the magnet on the plunger, at this plunger location, is greater than the opposing force of the spring). Thus, power need not be continually applied to the coil to maintain the valve in the open position.

To close the valve, a voltage (of opposite polarity used to open the valve) is momentarily applied to electrical leads 20 to induce an electrical current in the coil and a resulting magnetic field having flux lines parallel to the axis 86 (though in a direction opposite in polarity to the flux lines generated during the valve opening process). The force of the flux lines is sufficient to overcome the force difference between the permanent magnet 94 and the spring 76, and the plunger moves downward along axis 86. The valve is latched in the closed position by coil spring 78 which forces the pilot valve member into the diaphragm central opening 74 (the force of the spring on the plunger, at this plunger location, is greater than the opposing force of the permanent magnet). Thus, power need not be continually applied to the coil to maintain the valve in the closed position.

While such latching type valves present significant advantages over held type valves, much of the advantage provided by these valves could be lost through the inefficiencies of the conventional driver circuitry used to actuate these valves to their open and closed positions. Specifically, typical latching type valve driver circuits operate by energizing the solenoid for a fixed period of time for both the opening and closing event. The time chosen for the pulse period for the driver circuit is typically selected to ensure actual actuation of the valve, regardless of the particular valve actuation characteristics. That is to say, each latching type valve could have different operating characteristics that would vary the amount of time needed to reliably actuate the valve.

Further, as valves aged, their actuation time could vary. Additionally, the particular installation of the valve itself could also have a bearing on the actuation time required, including the temperature of the environment into which the valve is installed, the viscosity and pressure of the fluid which flows through the value, etc. Since all of these various factors could affect valve actuation time, the typical actuation drive circuit pulses the solenoid for an extended period of time to ensure actuation of the valve under the most adverse, worse case conditions for valve actuation time. While the design of these conventional actuation drive circuits is simple and ensures actuation of the valve, they are not very efficient because they continue to supply electric power to the solenoid of a valve which has already transitioned to its actuated state.

Such inefficiencies were not of great concern until the use of battery power was desired for remote installations of these valves. Since a battery has only a limited supply of energy available, maintaining the actuation pulse to the solenoid beyond the time required to actually actuate the valve solely serves to reduce the life of the battery needlessly, thereby reducing the number of valve actuations before battery replacement is required. Further, as a battery's energy is utilized its output voltage typically droops. This drooping actuation drive voltage adds an additional parameter to the actuation time of the valve. That is to say, as the drive voltage varies, so does the time required to actuate the valve from one position to the other. As the battery voltage continues to drop over time, it becomes desirable to have an indication of such low battery voltage so that reliable actuation of the valve may be maintained in all situations. Unfortunately, conventional monitoring means all dissipate additional energy, which serves to reduce the life of the battery that it is monitoring.

There, therefore, exists a need in the art for a new and improved valve driver circuit which will drive the solenoid of a latching type valve for only as long as is needed to ensure actuation of the valve under varying condition of temperature, fluid pressure, viscosity, and battery voltage. There also exists a need for a new and improved valve driver circuit which utilizes the minimum monitoring circuitry to allow such operation so as to not adversely affect battery life. Additionally, there exists a need for such a driver circuit which is capable of indicating a low battery condition without utilizing conventional sense of circuits which also tend to reduce battery life.

SUMMARY OF THE INVENTION

In view of the above it is, therefore, an object of the instant invention to provide a new and improved driver circuit suitable for operation with latching type valves. More particularly, it is an object of the instant invention to provide a new and improved driver circuit for latching type valves that conserves battery power. It is an additional object of the instant invention to provide a driver circuit for a latching type valve that compensates for changes in fluid pressure and viscosity, temperature, valve age, and variable battery drive voltage. It is also an object of the instant invention to provide such a drive circuit that minimizes power draw from the battery and, therefore, maximizes battery life. It is a further object of the instant invention to provide such a drive circuit which includes a low battery voltage indication.

In view of these objects, it is a feature of the instant invention that the latching valve driver dynamically determine the actuation time of the valve. It is also a feature of the instant invention that this actuation time information is utilized to control the actuation pulse to the valve solenoid. It is also a feature of the instant invention that the compensation for fluid pressure and viscosity be performed without sensing the pressure or viscosity of the fluid whatsoever. Further, it is a feature of the instant invention that the drive circuit compensate for temperature without actually sensing the temperature of the environment of the valve. Further, it is a feature of the instant invention that the drive circuit compensate for source battery voltage without sensing the actual battery voltage. It is an additional feature of the instant invention that the drive circuitry provide a low battery voltage indication. Additionally, it is a feature of the instant invention that the drive circuitry provide minimal power dissipation to extend battery life.

In view of these objects and features of the invention, a preferred embodiment of the instant invention provides a drive circuit for a latching type valve having a solenoid actuatable armature which transitions the valve between its opened and closed states. The valve maintains its current state through a spring and a permanent magnet, the spring maintaining one state and the permanent magnet maintaining the other. An external source of electric power, such as a battery, is available for driving the solenoid. The driver circuit comprises at least one switch having a resistive characteristic coupled to the solenoid, the switch completing a circuit from the external source of electric power through the solenoid. The circuitry further comprises a slope detection circuit coupled to the switch, the slope detection circuit monitoring a slope of a voltage developed across the switch. Additionally, a controller is in sensory communication with the slope detection circuit and in operable communication with the switch. The controller commands the switch to an ON state to actuate the valve, and to an OFF state upon indication of a positive slope of the voltage developed across the switch after indication of a negative slope of the voltage.

In a preferred embodiment, the at least one switch is a power MOSFET. Further, the driver circuit preferably comprises a second, third, and fourth switch coupled in an H-bridge configuration with the at least one switch. This configuration is operable to provide bidirectional current flow through the solenoid from the external source of electric power. Additionally, in a preferred embodiment of the instant invention all of the switches comprise power MOSFET devices. In a highly preferred embodiment, the at least one switch is positioned in the H-bridge configuration such that the slope detector monitors the slope of the voltage developed across the at least one switch during actuation of the valve to the open state. The controller commands two of the second, third, and fourth switches to an ON state for a predetermined period of time to actuate the valve to the closed state.

Alternatively, the controller commands a pair of the second, third, and fourth switches to an ON state to actuate the valve to the closed state. In this alternate embodiment the driver circuit further comprises a second slope detection circuit coupled across one of the pair of switches, and the controller further commands the pair of switches to an OFF state upon indication of a positive slope of a voltage developed across the one of the pair of switches after indication of a negative slope of the voltage. Preferably, the controller measures an actuation period from commanding the pair of switches to an ON state to indication of a positive slope of the voltage developed across the one of the pair of switches after indication of a negative slope of the voltage. The controller further provides an alarm output when the actuation period exceeds a predetermined period.

In an alternate preferred embodiment of the instant invention, a solenoid driver circuit comprises a first, second, third, and fourth MOSFET configured in an H-bridge having a coupling for an external source of electric power at a first node between the first and the second MOSFETs, and a coupling for a circuit return at a second node between the third and the fourth MOSFETs. The H-bridge further provides a coupling to a solenoid at a third node between the first and the third MOSFETs and at a fourth node between the second and the fourth MOSFETs. The driver circuit further comprises a first slope detection circuit having an input coupled to the fourth node, which provides an output indication of a slope of a voltage developed across the fourth MOSFET. The driver circuit also includes a microprocessor having an output drivably coupled to each of the MOSFETs and an input coupled to the output of the first slope detection circuit. The microprocessor turns on the first and fourth MOSFETs until the output of the first slope detection circuit indicates a positive slope after indication of negative slope. Preferably, the microprocessor turns on the second and third MOSFETs for a predetermined period of time.

In an alternate preferred embodiment, the driver circuit further comprises a second slope detection circuit having an input coupled to the third node. This second slope detection circuit provides an output indication of a slope of a voltage developed across the third MOSFET. In this embodiment, the microprocessor includes a second input coupled to the output of the second slope detection circuit, and turns on the second and third MOSFETs until the output of the second slope detection circuit indicates a positive slope after indication of negative slope. Further, the microprocessor measures an actuation period from turning on the second and the third MOSFETs to indication of a positive slope after indication of a negative slope. The microprocessor provides an alarm output when the actuation period exceeds a predetermined period. Alternatively or additionally, the microprocessor measures an actuation period from turning on the first and the fourth MOSFETs to indication of a positive slope after indication of a negative slope so that it may provide an alarm output when the actuation period exceeds a predetermined period.

In an alternate embodiment of the instant invention, a latching valve driver circuit comprises a switch assembly configured to supply electric power to the solenoid in a selectable bidirectional manner, a controller coupled to switch assembly, the controller providing first control signals to the switch assembly to configure individual switches of the switch assembly to supply electric power to the solenoid in a first selected direction to actuate the latching valve, and a slope detection circuit coupled to the switch assembly and to the controller, the slope detection circuit sensing a voltage generated across one of the individual switches representative of a current flowing through the solenoid in the first selected direction. In this embodiment, the controller preferably removes the first control signals upon the slope detection circuit sensing a positive slope after a negative slope.

Preferably, the switch assembly comprises at least one MOSFET device, and the slope detection circuit senses a voltage generated across the MOSFET device. In a further preferred embodiment, the controller provides second control signals to the switch assembly to configure individual switches of the switch assembly to supply electric power to the solenoid in a second selected direction to actuate the latching valve. The controller removes the second control signals upon expiration of a predetermined time period. Alternatively, the controller provides second control signals to the switch assembly to configure individual switches of the switch assembly to supply electric power to the solenoid in a second selected direction to actuate the latching valve. The driver further comprises a second slope detection circuit coupled to the switch assembly and to the controller. Preferably, the second slope detection circuit senses a voltage generated across one of the individual switches representative of a current flowing through the solenoid in the second selected direction opposite the first selected direction. The controller also preferably removes the second control signals upon the second slope detection circuit sensing a positive slope after a negative slope. Alternatively, the controller measures an actuation period from provision of the first control signals to indication of a positive slope after indication of a negative slope. Thereafter, the controller provides an alarm output when the actuation period exceeds a predetermined period.

Other objects and advantages of the invention will become more apparent from the following detailed description when taken in conjunction with the accompanying drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE PREFERRED EMBODIMENT

Figure 1:
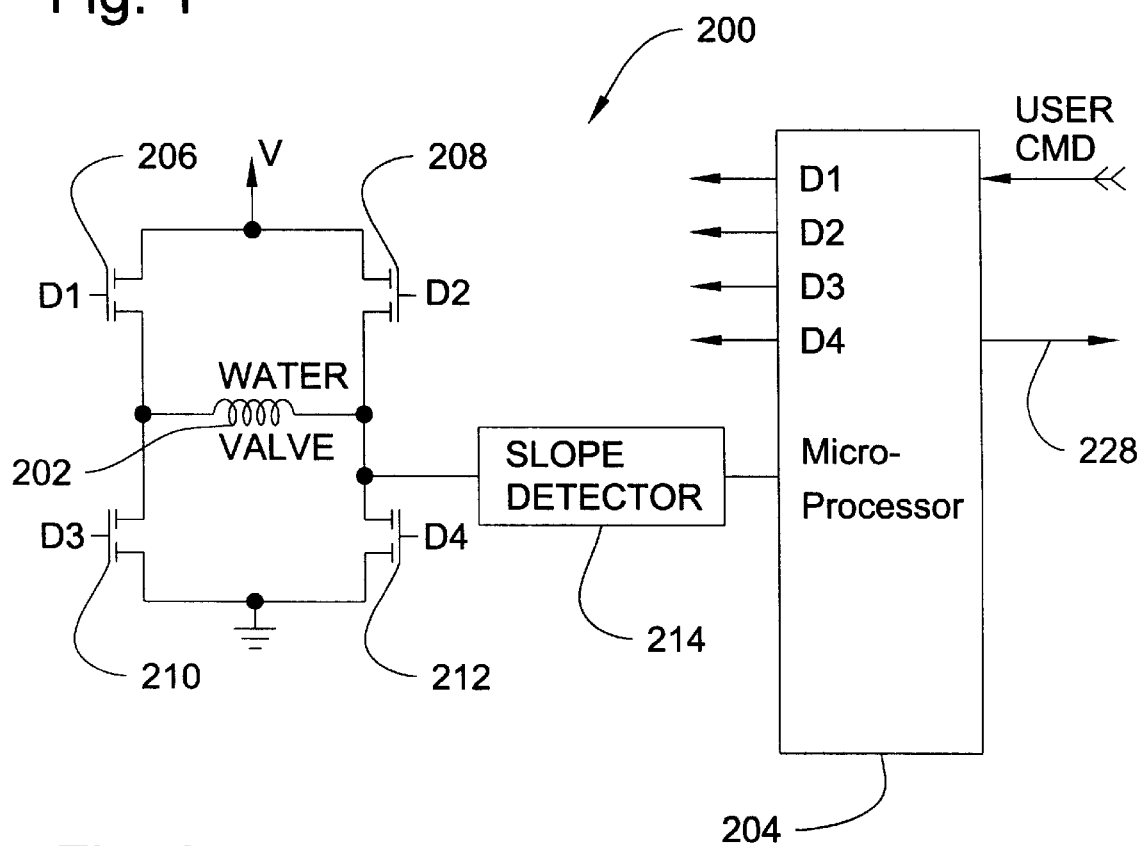
FIG. 1 is a simplified single-line circuit diagram of a drive circuit in accordance with the teachings of the instant invention.

A preferred embodiment of a driver circuit for a latching type valve is illustrated in simplified single line schematic form in FIG. 1. This preferred driver circuit 200 energizes a latching type valve's solenoid coil 202 upon command of the driver controller, illustrated as microprocessor 204. To provide reversible polarity drive signals to the water valve solenoid 202, the drive circuit 200 utilizes four electronic switches 206, 208, 210, and 212 configured in an H-bridge configuration. This H-bridge configuration allows the switching network to direct the electric power supplied by an external battery (not shown) to the valve solenoid 202 in alternate directions to actuate the valve between its two positions of opened and closed. To apply a voltage of a first polarity to the solenoid coil 202, microprocessor 204 energizes switches 206 and 212 while maintaining switches 208 and 210 in their OFF state. To energize the solenoid coil 202 with a voltage of the opposite polarity, the microprocessor 204 energizes switches 208 and 210, while maintaining switches 206 and 212 in their OFF state.

Because a preferred implementation of the circuit 200 of the instant invention is in a system which uses an external battery as the source of voltage to drive the solenoid coil 202, a preferred embodiment of the instant invention utilizes power MOSFET devices for the electronic switches 206, 208, 210 and 212. These power MOSFET devices are chosen because they are very low impedance devices which allow the delivery of as much power to the coil 202 as possible from the battery. To further conserve the energy expended by the battery to actuate the valve, the drive circuit 200 of the instant invention utilizes a slope detector circuit 214 to determine when the solenoid valve has actuated so that the microprocessor 204 may de-energize all of the switches 206–212 to further conserve battery power. The operation of this slope detector will be described more fully below with regard to FIG. 2. Of significance at this point, however, is that the slope detector circuit 214 does not require the insertion of a typical current sense resistor in the drive circuit to sense the current flowing through coil 202 as is required in most circuits. This advantage is realized through the implementation of the power MOSFET devices as switches 206–212. Specifically, the current sense is taken from the drain to source connection of the driving power MOSFET due to the resistive characteristic of the device. In addition to eliminating the need for a separate sense resistor, which would dissipate additional power and further reduce the life of the external battery, it also reduces the cost and increases the reliability of the overall system.

Conventional systems typically utilize fixed length pulses applied to the solenoid coil of the valve, which applies essentially the same energy to the valve under all conditions. These conventional systems do not provide an efficient means to operate the valve, especially when a battery is utilized as the source of electric power. As recognized by the applicants, the delivery of a fixed amount of energy under all conditions is inefficient due to the many variables that affect the valve opening and closing. One such variable which greatly affects the amount of energy required to actuate a valve is the applied pressure of the fluid. The battery voltage to the valve coil also effects the operation of the valve, and is inversely proportional to the pulse time required to actuate the valve. A more efficient drive circuit would need to take into account at least these two variables, but sensing of these parameters greatly adds to the cost and complexity of a drive circuit. Further, the applicants recognize that the movement away from the permanent magnet of the latching type valve, or from the ON to the OFF position, requires less energy than to actuate the valve from its OFF to its ON position. In fact, experimentation conducted by the applicants revealed that, for both varying pressure and battery voltage, the mere application of a very short pulse is suitable to actuate the valve from its ON to its OFF position. For example, the applicants have found that a pulse of 20 milliseconds may be sufficient in some applications.

In order to conserve the maximum energy possible while absolutely ensuring that the valve is actuated to its desired position, the preferred embodiment of the instant invention monitors the actual armature movement to provide direct feedback to the controller to determine, in a closed loop fashion, the specific amount of time required to pulse the valve coil 202 for opening the valve. In view of the relatively short pulse required to close the valve as determined from the above-described experimentation, a simplified preferred embodiment of the instant invention simply includes a fixed time for the pulse to the solenoid coil to close the valve. While monitoring the armature movement can be done in many ways, most are cumbersome and expensive, and would tend to negatively increase the cost and decrease the reliability of this drive circuitry. A method to monitor this armature movement indirectly involves phenomena detectable from the current flowing through the coil during the on pulse. These phenomena will be explained with reference to FIG. 2.

Figure 2:
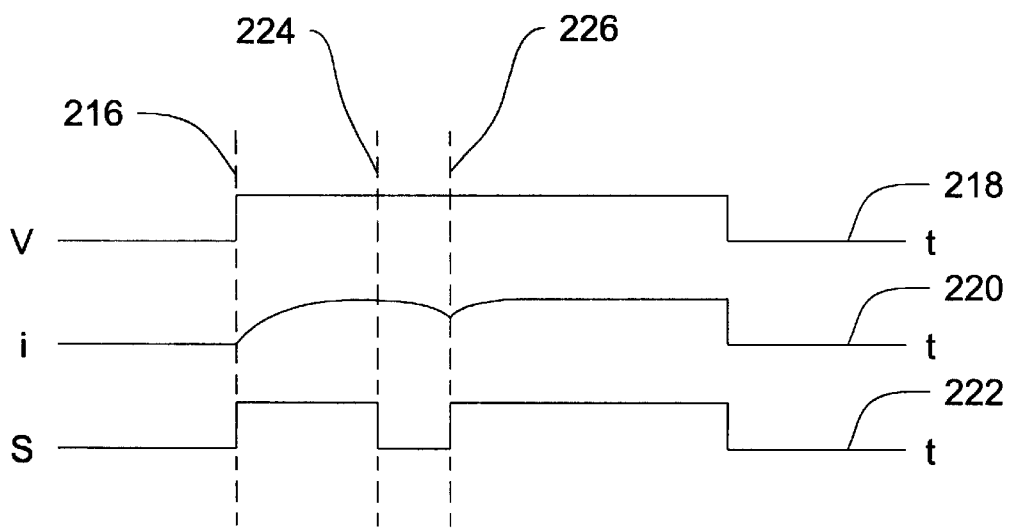
FIG. 2 illustrates current sense and control signal waveforms illustrating operation and operational characteristics in accordance with the teachings of the instant invention.

As may be seen from this FIG. 2, once the voltage has been applied to the coil as indicated at point 216 of voltage trace 218, the coil current 220 begins to increase. At this point, the output 222 of the slope detector 214 of FIG. 1 increases to indicate a positive current slope. At point 224 sufficient energy has been established in the solenoid coil to begin the armature movement to its ON position. While the armature is moving, an electromotive force (EMF) is developed which is reflected in the current waveform 220 as a slight dip in current flow during armature transition. This dip in current flow beginning at point 224 is detected by the slope detector 214 (see FIG. 1) whose output 222 drops low to indicate a negative slope of the sensed current waveform. Once the armature has fully transitioned to its actuated ON position, the developed EMF ceases and the current 220 through the valve solenoid is again allowed to increase as indicated in FIG. 2 at point 226. This increase in current is again sensed by the slope detector 214 whose output 222 reflects a positive increase indicative of a positive current slope.

By utilizing this phenomena as a closed loop feedback to the microprocessor, the control will apply a pulse from the external battery for only as long as is required to move the armature to the open position. In this way, the circuit is self compensating for any conditions that affect the armature movement, including pressure, battery voltage, temperature, etc., since it is operating in a closed loop mode. By implementing such closed loop control, the microprocessor 204 may also institute a timing monitor which could indicate via signal 228 a malfunctioning valve or a low battery voltage condition when the time to actuate the valve exceeds a predetermined threshold. While actuation time will vary depending upon the pressure and temperature of the system, these parameters typically operate within a fairly well known band. The predetermined threshold may be set outside of this normal operating band taking into account maximum expected variations of pressure, temperature, and normal battery voltage, so that only a failed valve or extremely low battery voltage would result in the output indication 228.

Figure 3:
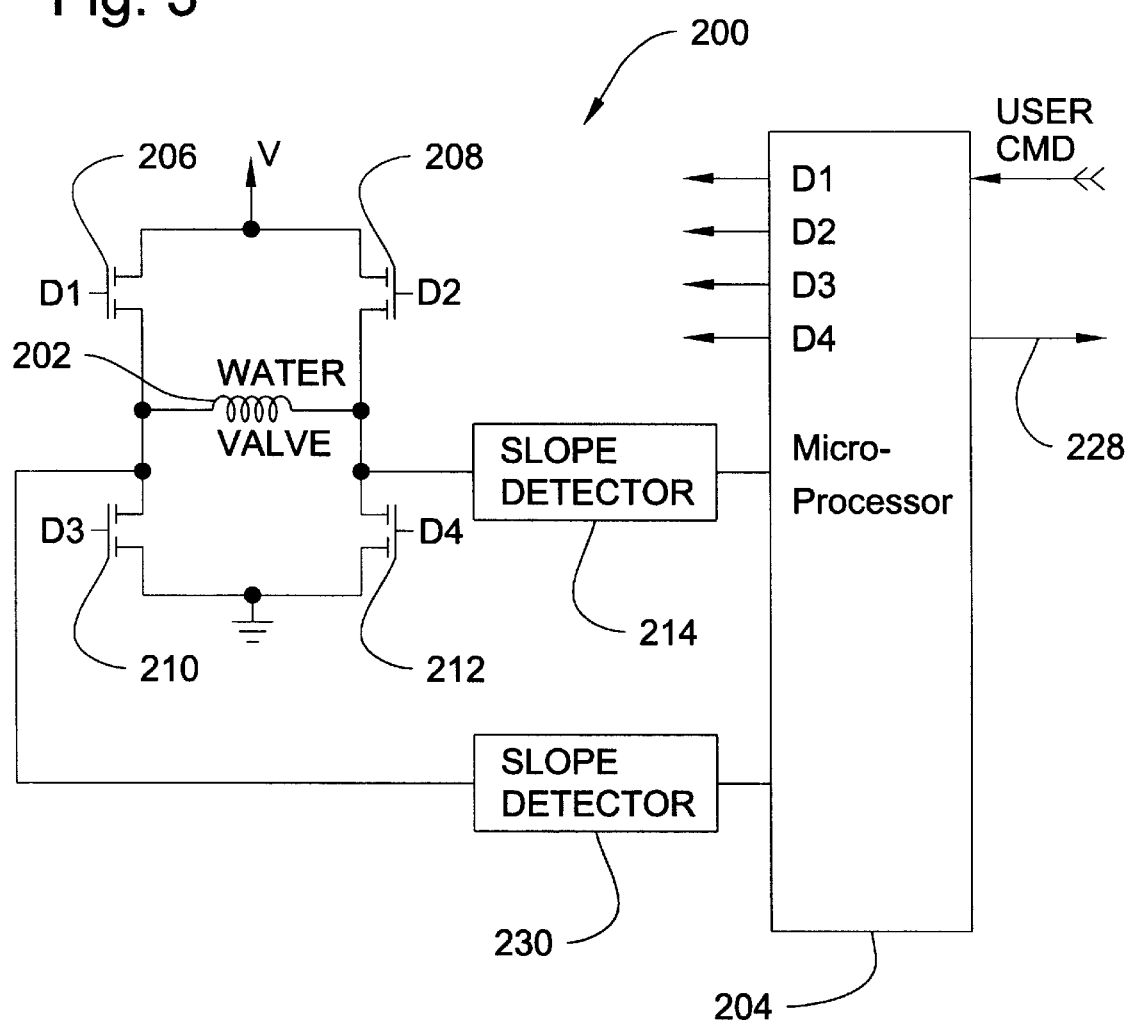
FIG. 3 illustrates an alternate embodiment in simplified single line schematic form of a drive circuit in accordance with the teachings of the instant invention.

In some installations it may be desirable to sense the actual transition time of the armature of the latching valve for both actuation to the opened and closed positions. In such a situation, an alternate embodiment of the instant invention is illustrated in FIG. 3 which provides a second slope detector circuit 230 for monitoring the current flow during transition to the OFF position. As will be recognized by one skilled in the art, the two slope detectors 214, 230 illustrated in FIG. 3 could be implemented by a single circuit which selectively senses the current flow. However, for the sake of simplicity and ease of understanding, two functional blocks 214 and 230 have been illustrated. With this embodiment of the instant invention, the microprocessor 204 may monitor the actual actuation of the latching valve armature for both an open and a close transition and control the drive pulse to the individual switches 206–212 to maintain current flow in the solenoid coil 202 for only as long as is necessary to actually actuate the valve.

However, it should be recognized that such control of the OFF pulse may actually result in a pulse which is longer in duration than that preset in the embodiment of FIG. 1. This is because experimentation has shown that once the armature has moved away from the permanent magnet which holds it into its ON latched state, the spring force is sufficient at some point prior to the valve actuator coming to rest in its OFF position to continue to transition the armature without additional energy being provided to the solenoid coil. However, by monitoring the slope of the coil current for feedback control providing an indication to the microprocessor that it is satisfactory to turn off the particular switches, the output pulse will actually last until the armature has fully transitioned to its closed position. This is so even though the spring force would have been sufficient to continue the movement of the armature beyond a certain point. It should be noted that ON and OFF states are relative, and may be reversed in the above discussions, depending on the configuration of the permanent magnet and spring in the valve.

Figure 4:
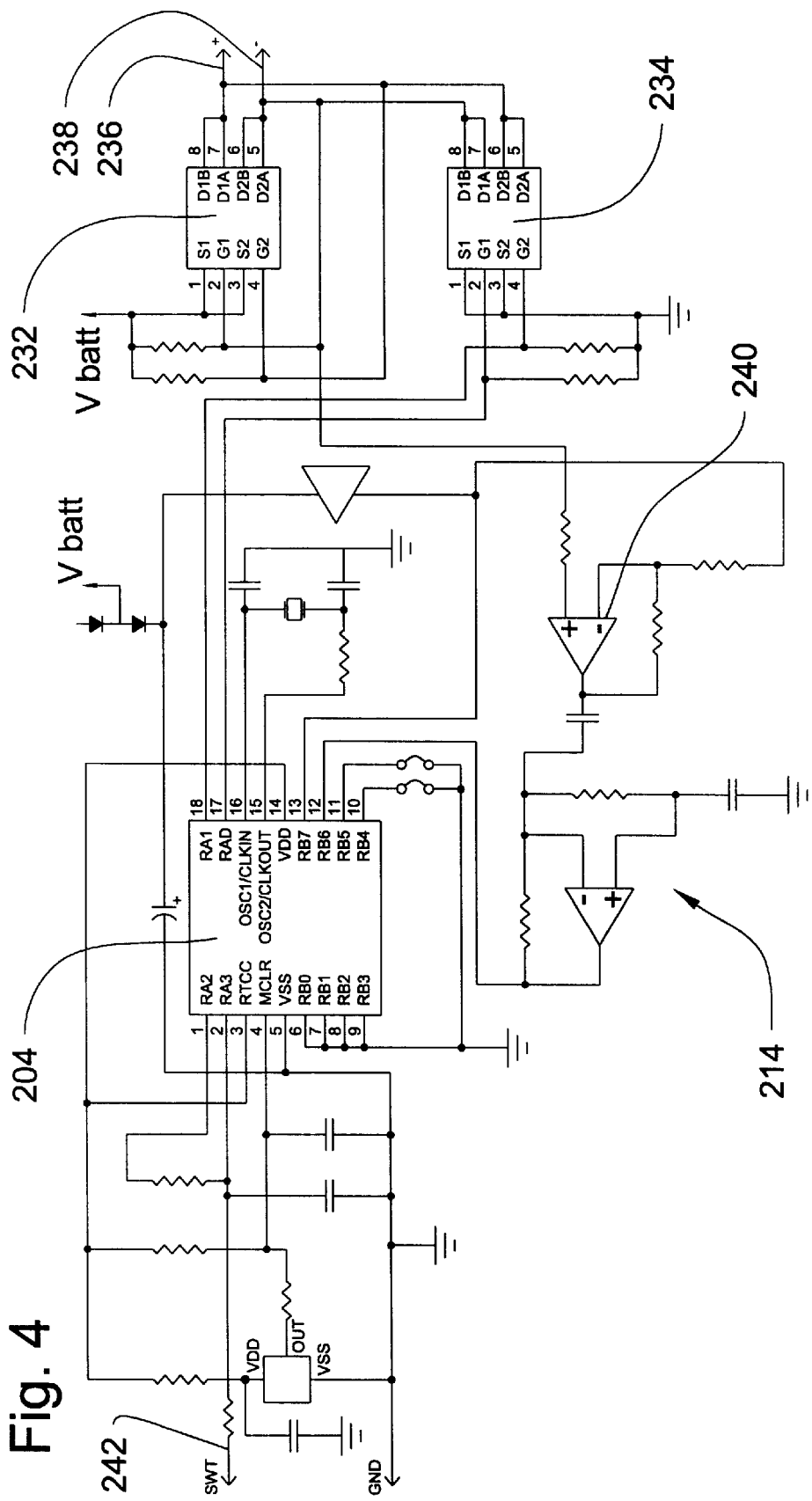
FIG. 4 illustrates a detailed schematic diagram of an embodiment of the instant invention.
Figure 5:
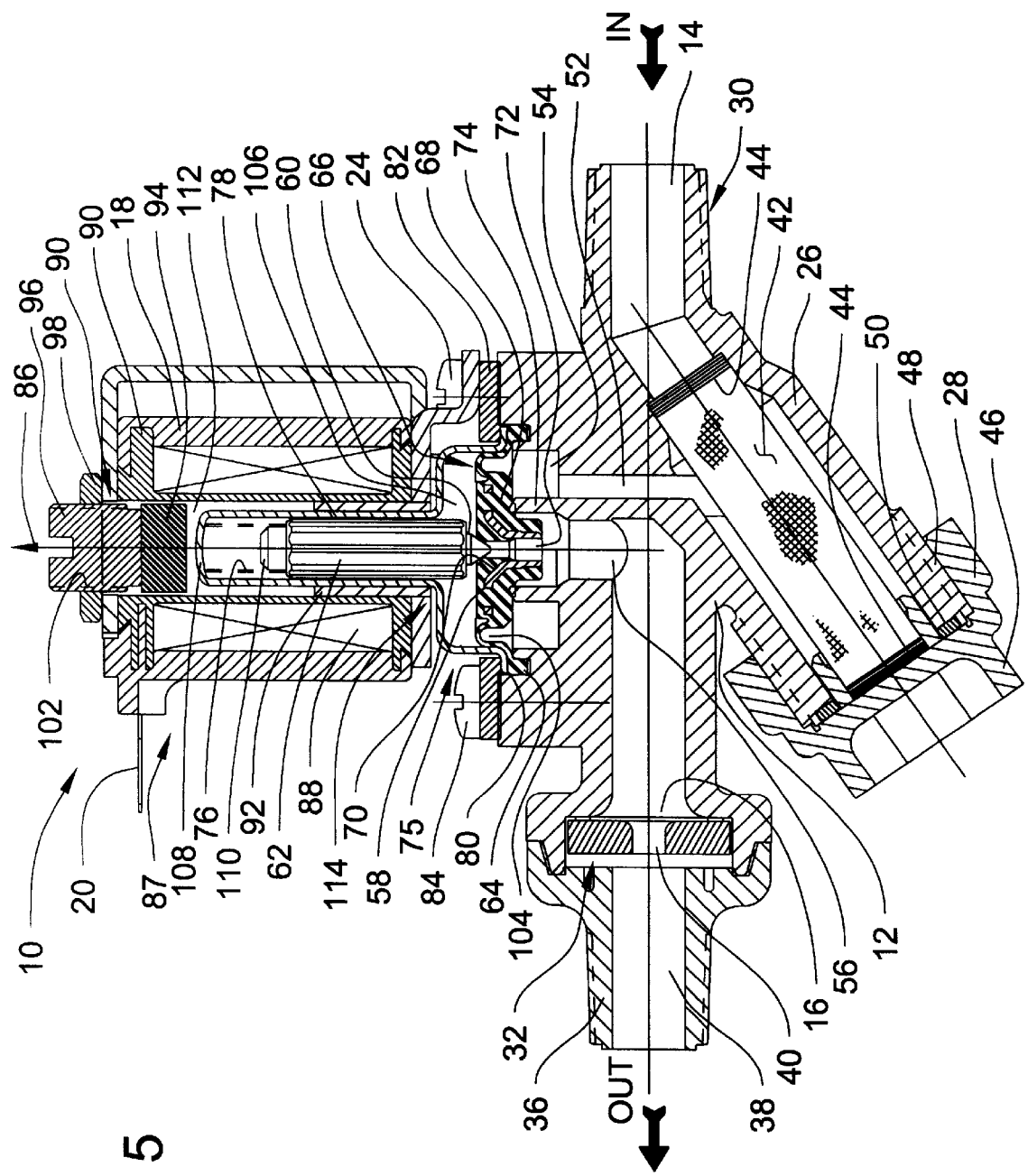
FIG. 5 illustrates a latching valve suitable for operation with the drive circuit of the instant invention.

While one skilled in the art will recognize that many different particular implementations of the teachings described above are possible and are within the scope of the invention, an exemplary embodiment of one such implementation is illustrated in FIG. 4. This exemplary implementation is provided by way of example, and not by way of limitation. In this exemplary implementation, the H-bridge configured switches are provided in dual switch package configurations including two P-channel power MOSFETs 232, and two N-channel power MOSFETs 234. These switches are configured in an H-bridge configuration, and are coupled to the valve solenoid coil via leads 236 and 238. To generate the square wave output of slope detector 214, differential amplifier 240 samples the drain of device 2 of package 232, and device 1 of package 234. The output from this differential amplifier 240 is input to the slope detector 214 which generates the output square type wave signal 222 illustrated in FIG. 2 to the microprocessor 204. As may be seen from this exemplary circuit implementation, lead 242 may be utilized to input a user operational switch to provide remote control availability to a user.

Numerous modifications and alternative embodiments of the invention will be apparent to those skilled in the art in view of the foregoing description. Accordingly, this description is to be construed as illustrative only and is for the purposes of teaching those skilled in the art the best mode for carrying out the invention. The details of the structure may be varied substantially without departing from the spirit of the invention, and exclusive use of all modifications that come within the scope of the appended claims is reserved.

What is claimed is:

1. A driver circuit for a latching type valve having a solenoid actuatable armature which transitions the valve between its opened and closed states, the valve maintaining its current state through a spring and a permanent magnet, the spring maintaining one state and the permanent magnet maintaining the other, an external source of electric power being available for driving the solenoid, the driver circuit comprising:

at least one switch having a resistive characteristic coupled to said solenoid, said switch completing a circuit from the external source of electric power through the solenoid;

a slope detection circuit coupled to said switch, said slope detection circuit monitoring a slope of a voltage developed across said switch;

a controller in sensory communication with said slope detection circuit and in operable communication with said switch, said controller commanding said switch to an on state to actuate the valve, said controller further commanding said switch to an off state upon indication of a positive slope of said voltage developed across said switch after indication of a negative slope of said voltage.

2. The driver circuit of claim 1, wherein said at least one switch is a power MOSFET.

3. The driver circuit of claim 1, further comprising a second, third, and fourth switch coupled in an H-bridge configuration with said at least one switch, said configuration operable to provide bidirectional current flow through the solenoid from the external source of electric power.

4. The driver circuit of claim 3, wherein said switches comprise power MOSFET devices.

5. The driver circuit of claim 3, wherein said at least one switch is positioned in said H-bridge configuration such that said slope detector monitors said slope of said voltage developed across said at least one switch during actuation of the valve to the open state.

6. The driver circuit of claim 5, wherein said controller commands two of said second, third, and fourth switches to an on state for a predetermined period of time to actuate the valve to the closed state.

7. The driver circuit of claim 5, wherein said controller commands a pair of said second, third, and fourth switches to an on state to actuate the valve to the closed state, and wherein the driver circuit further comprises a second slope detection circuit coupled across one of said pair of switches, said controller further commanding said pair of switches to an off state upon indication of a positive slope of a voltage developed across said one of said pair of switches after indication of a negative slope of said voltage.

8. The driver circuit of claim 7, wherein said controller measures an actuation period from commanding said pair of switches to an on state to indication of a positive slope of said voltage developed across said one of said pair of switches after indication of a negative slope of said voltage, said controller providing an alarm output when said actuation period exceeds a predetermined period.

9. The driver circuit of claim 1, wherein said controller measures an actuation period from commanding said switch to an on state to indication of a positive slope of said voltage developed across said switch after indication of a negative slope of said voltage, said controller providing an alarm output when said actuation period exceeds a predetermined period.

10. A solenoid driver circuit, comprising:

a first, second, third, and fourth MOSFET configured in an H-bridge having a coupling for an external source of electric power at a first node between said first and said second MOSFETs, and a coupling for a circuit return at a second node between said third and said fourth MOSFETs, said H-bridge further providing a coupling to a solenoid at a third node between said first and said third MOSFETs and at a fourth node between said second and said fourth MOSFETs;

a first slope detection circuit having an input coupled to said fourth node, said first slope detection circuit providing an output indication of a slope of a voltage developed across said fourth MOSFET; and a microprocessor having an output drivably coupled to each of said MOSFETs and an input coupled to said output of said first slope detection circuit, and wherein said microprocessor turns on said first and fourth MOSFETs until said output of said first slope detection circuit indicates a positive slope after indication of negative slope.

11. The driver circuit of claim 10, wherein said microprocessor turns on said second and third MOSFETs for a predetermined period of time.

12. The driver circuit of claim 10, further comprising a second slope detection circuit having an input coupled to said third node, said second slope detection circuit providing an output indication of a slope of a voltage developed across said third MOSFET, and wherein said microprocessor includes a second input coupled to said output of said second slope detection circuit, and wherein said microprocessor turns on said second and third MOSFETs until said output of said second slope detection circuit indicates a positive slope after indication of negative slope.

13. The driver circuit of claim 12, wherein said microprocessor measures an actuation period from turning on said second and said third MOSFETs to indication of a positive slope after indication of a negative slope, said microprocessor providing an alarm output when said actuation period exceeds a predetermined period.

14. The driver circuit of claim 10, wherein said microprocessor measures an actuation period from turning on said first and said fourth MOSFETs to indication of a positive slope after indication of a negative slope, said microprocessor providing an alarm output when said actuation period exceeds a predetermined period.

15. A latching valve driver circuit, comprising:

a switch assembly configured to supply electric power to the solenoid in a selectable bidirectional manner;

a controller coupled to switch assembly, said controller providing first control signals to said switch assembly to configure individual switches of said switch assembly to supply electric power to the solenoid in a first selected direction to actuate the latching valve; and a slope detection circuit coupled to said switch assembly and to said controller, said slope detection circuit sensing a voltage generated across one of said individual switches representative of a current flowing through the solenoid in said first selected direction; and wherein said controller removes said first control signals upon said slope detection circuit sensing a positive slope after a negative slope.

16. The driver circuit of claim 15, wherein said switch assembly comprises at least one MOSFET device, and wherein said slope detection circuit senses a voltage generated across said MOSFET device.

17. The driver circuit of claim 15, wherein said controller provides second control signals to said switch assembly to configure individual switches of said switch assembly to supply electric power to the solenoid in a second selected direction to actuate the latching valve, and wherein said controller removes said second control signals upon expiration of a predetermined time period.

18. The driver circuit of claim 15, wherein said controller provides second control signals to said switch assembly to configure individual switches of said switch assembly to supply electric power to the solenoid in a second selected direction to actuate the latching valve, the driver further comprising a second slope detection circuit coupled to said switch assembly and to said controller, said second slope detection circuit sensing a voltage generated across one of said individual switches representative of a current flowing through the solenoid in said second selected direction opposite said first selected direction, and wherein said controller removes said second control signals upon said second slope detection circuit sensing a positive slope after a negative slope.

19. The driver circuit of claim 15, wherein said controller measures an actuation period from provision of said first control signals to indication of a positive slope after indication of a negative slope, said controller providing an alarm output when said actuation period exceeds a predetermined period.

* * * * *